(12) United States Patent
Hwang et al.

(10) Patent No.: US 6,207,488 B1
(45) Date of Patent: Mar. 27, 2001

(54) METHOD FOR FORMING A TANTALUM OXIDE CAPACITOR USING TWO-STEP RAPID THERMAL NITRIDATION

(75) Inventors: Ki-hyun Hwang, Yongin; Jae-young Park, Seoul; Jae-ho Byun, Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/177,841

(22) Filed: Oct. 22, 1998

(30) Foreign Application Priority Data

Oct. 22, 1997 (KR) .................................................. 97-54217

(51) Int. Cl.$^7$ ........................ H01L 21/8242; H01L 21/00
(52) U.S. Cl. ................... 438/240; 438/3; 438/964
(58) Field of Search ..................... 438/238, 239, 438/240, 397, 398, 393, 235, 3, 964

(56) References Cited

U.S. PATENT DOCUMENTS

| | | | |
|---|---|---|---|
| 5,362,632 | * 11/1994 | Mathews | 438/152 |
| 5,468,687 | * 11/1995 | Carl et al. | 438/393 |
| 5,741,734 | * 4/1998 | Lee | 438/235 |
| 5,939,131 | * 8/1999 | Kim et al. | 427/81 |
| 5,963,300 | * 6/1998 | Park et al. | 438/240 |
| 5,985,730 | * 11/1999 | Lim | 438/393 |
| 6,010,931 | * 1/2000 | Sun et al. | 438/240 |

* cited by examiner

Primary Examiner—Carl Whitehead, Jr.
Assistant Examiner—Brook Kebede
(74) Attorney, Agent, or Firm—Marger Johnson & McCollom, P.C.

(57) ABSTRACT

A method for forming a $Ta_2O_5$ capacitor on a semiconductor device reduces leakage current and increases cell capacitance by utilizing a two-step rapid thermal nitridation (RTN) process to form a nitride layer on a hemi-spherical grain (HSG) storage node. The first RTN process is performed in a $NH_3$ atmosphere at 800±40° C. for 180±60 seconds, thereby forming a nitride layer having a thickness of about 4 Å. The second RTN process is performed in a $NH_3$ atmosphere at 850±40° C. for 180±60 seconds, thereby increasing the thickness of the nitride layer to at least about 7 Å. Therefore, a nitride layer that is thick enough to act as an oxidation barrier is achieved, but agglomeration of the HSGs on the storage node due to high process temperatures is prevented. To make the structure more readily adaptable to process for manufacturing DRAMs with $Ta_2O_5$ dielectric layers, a rapid thermal oxidation (RTO) process can then be performed in an $O_2$ or $N_2O$ atmosphere at 850±50° C. for 90±30 seconds to thereby form a combined layer comprising a nitride layer and an oxide layer.

20 Claims, 5 Drawing Sheets

US 6,207,488 B1

METHOD FOR FORMING A TANTALUM OXIDE CAPACITOR USING TWO-STEP RAPID THERMAL NITRIDATION

This application corresponds to Korean patent application No. 97-54217 filed Oct. 22, 1997 in the name of Samsung Electronics Co., Ltd., which is herein incorporated by reference for all purposes.

BACKGROUND OF THE INVENTION

1. Field of the Invention

This invention relates generally to capacitors for semiconductor devices, and more particularly, to a method for forming a capacitor having a tantalum oxide dielectric using a two-step rapid thermal nitridation process.

2. Description of the Related Art

In general, each memory cell of a dynamic random access memory (DRAM) includes one capacitor and one transistor. Each capacitor, which is used for storing information, is very important for the DRAM device. However, as semiconductor devices becomes more highly integrated and device geometries become finer, each memory cell becomes smaller and lower operational voltages are used. Accordingly, it is necessary to increase the capacitance of each capacitor to obtain the desired drive characteristics for each cell. If the capacitance is insufficient, the refresh time is reduced, and the reliability and yield ratio thereof deteriorate. However, even though increased integration levels result in increased leakage current, acceptable devices are still obtained, and production efficiency increases, if the capacitance exceeds a predetermined level.

Some techniques for increasing the cell capacitance include: increasing the effective area of a capacitor by employing a cylindrical or pin-type storage electrode; forming a dielectric layer using a high dielectric material; and reducing the thickness of the dielectric layer. One method for forming a dielectric layer using a high dielectric material involves forming a $Ta_2O_5$ dielectric layer having good step coverage even at the storage node of a complicated structure. Such a technique is disclosed in the paper "Ultrathin Tantalum Oxide Capacitor Dielectric Layer Fabricated Using Rapid Thermal Nitridation Prior To Low Pressure Chemical Vapor Deposition" by S. Kamiyama et al., Soc., Vol. 140, No. 6, P.1617, 1993, NEC Co.

FIG. 1 is a flowchart illustrating a conventional method for forming a capacitor having a $Ta_2O_5$ dielectric layer. Referring to FIG. 1, a stack type storage node is formed on a semiconductor substrate where a lower structure is formed (step 51). Then a cleaning process is performed (step 53). Subsequently, a rapid thermal nitridation (RTN) process is performed in a $NH_3$ atmosphere at 900° C. for 90 seconds to form a nitride layer having a thickness of 7 Å or more on the semiconductor substrate (step 55). A $Ta_2O_5$ layer is deposited on the semiconductor substrate through low pressure chemical vapor deposition (LPCVD) where the RTN process has been performed (step 57), and then annealing is in a UV-ozone atmosphere (step 59). Then, wet or dry oxidation is performed for 30 min (step 61), and a barrier layer is deposited using TiN (step 63), Then a plate node is formed (step 65).

FIG. 2 is a graph of cell capacitance values measured after an RTN process is performed on a storage node having a surface with hemispherical grains (HSGs). Referring to FIG. 2, the X-axis indicates cell capacitance (fF/cell) and the Y-axis indicates the distribution (%) of measured points, respectively. The line represented by (■) indicates the measured result after the RTN-process is performed at 900° C. for 90 sec, and the line represented by (□) indicates the measured result after the RTN-process is performed at 850° C. for 90 sec. As shown in FIG. 2, the capacitance of a device processed at 850° C. is larger than that at 900° C. This is because the HSGs on the surface of the storage node are agglomerated through the RTN-process at 900° C. That is, when the HSGs agglomerate, the effective surface area of the storage node is reduced, and thus the capacitance is reduced. Meanwhile, the HSGs processed at 850° C. are less agglomerated than at 900° C., and thus, their capacitance is greater. That is, when the RTN process is performed at 900° C., the characteristics of the lower structure such as the storage electrode are deteriorated.

When the RTN is performed at 850° C., the agglomeration of HSGs is suppressed, however, a thickness of the nitride layer produced therefrom is limited to a predetermined level.

FIG. 3 is a graph of the thickness of a nitride layer formed by performing an RTN-process at 850° C. for various times. Referring to FIG. 3, the X-axis indicates RTN times and the Y-axis indicates the thicknesses of the resulting nitride layer. As shown in FIG. 3, when the RTN-process is performed at 850° C., the nitride layer grows for approximately 100 sec, however, the nitride layer then arrives at a saturation state, and the growth of the nitride layer is suppressed at a thickness of less than 4.5 Å. However, the thickness of a nitride layer formed through the RTN process should be at least 7 Å to suppress oxidation of the storage node after deposition of the $Ta_2O_5$ dielectric layer. When the RTN-process is performed at 850° C., the thickness of the nitride layer is insufficient, and thus the nitride layer does not act as an oxidation barrier. Accordingly, during a later oxidation process, an oxide layer having a low dielectric constant is formed under the nitride layer. When the oxidation layer having a low dielectric constant grows under the nitride layer, the overall thickness of the dielectric layer increases, and thus, capacitance decreases and leakage current increases.

That is, when the RTN-process is performed at 900° C., HSGs on the surface of the storage node agglomerate, thereby reducing the effective area of a capacitor and reducing the capacitance. Also, temperatures of 900° C. or higher deteriorate the electrical characteristics of 256 megabit and 1 gigabit DRAM devices. However, when the RTN-process is performed at 850° C., the HSGs on the surface of the storage node do not agglomerate, but the thickness of the nitride layer is limited to a predetermined level.

SUMMARY OF THE INVENTION

To solve the above problems, it is an object of the present invention to provide a method for forming a nitride layer for a capacitor having a $Ta_2O_5$ dielectric layer, wherein the nitride layer has a sufficient thickness, but the transformation of an HSG storage node is suppressed.

To achieve the above object, a method for forming of a capacitor having a $Ta_2O_5$ dielectric layer in accordance with the present invention includes: forming a capacitor storage node on a semiconductor substrate; and performing first and second rapid thermal nitridation (RTN) with respect to the semiconductor substrate where the storage node is formed. The second RTN process is performed at a temperature higher than the first RTN process. The $Ta_2O_5$ dielectric layer is then deposited on the semiconductor substrate after the second RTN process is completed.

It is preferable that the storage node has a surface including HSGs, and the device is cleaned after forming the storage node.

Preferably, the first RTN process is performed at 800±40° C. for 180±60 sec, and the second RTN process is performed at 850±40° C. for 180±60 sec. The first and second RTN processes are preferably performed such that a nitride layer having a thickness of 7 Å or more is formed, and a rapid thermal oxidation (RTO) process is performed after the first and second RTN processes.

The RTO process is performed at 850±50° C. for 90±30 sec in an $O_2$ or $N_2O$ atmosphere.

DETAILED DESCRIPTION

Embodiment 1

Figure 1:
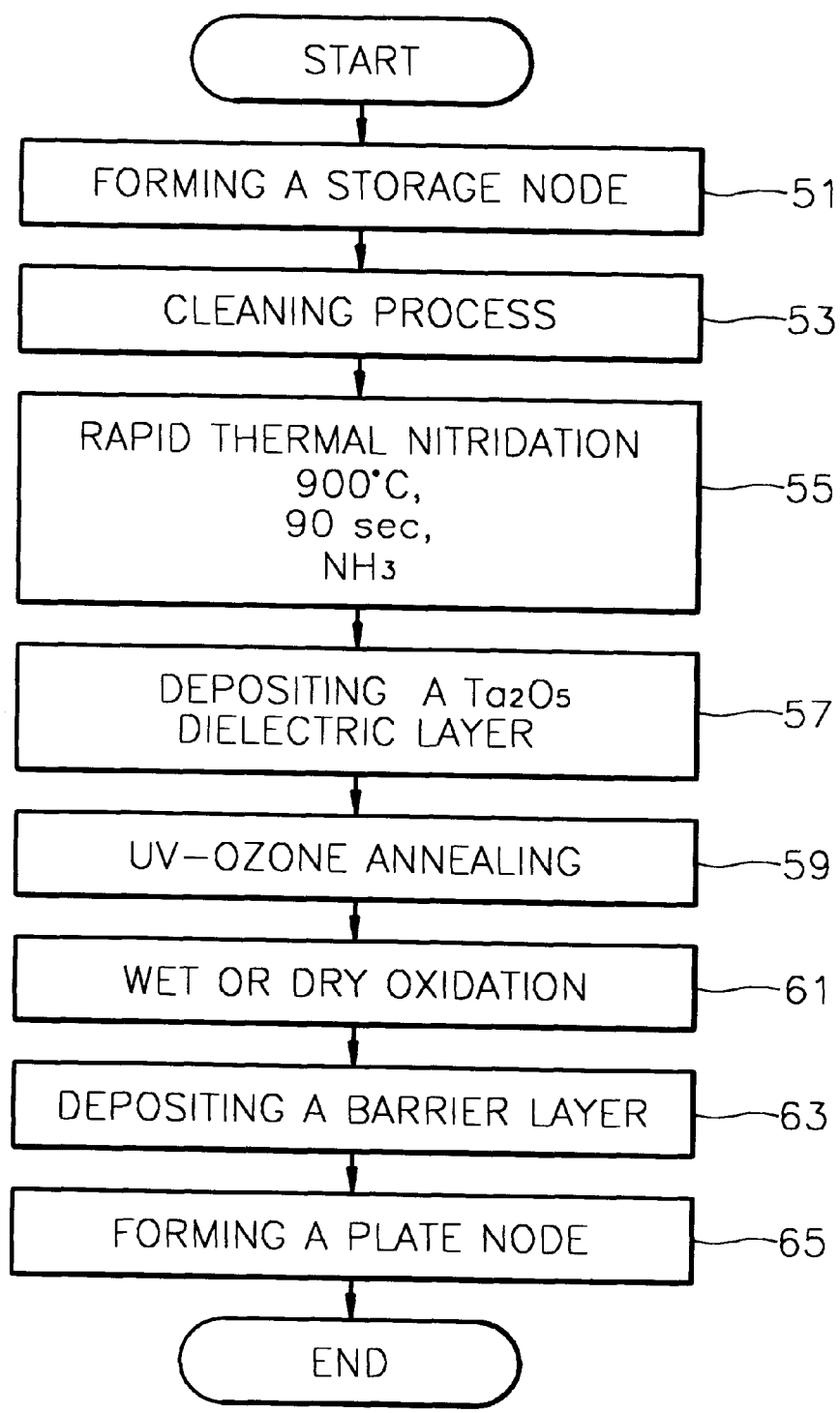
FIG. 1 is a flowchart illustrating a conventional method for forming a capacitor having a $Ta_2O_5$ dielectric layer.
Figure 2:
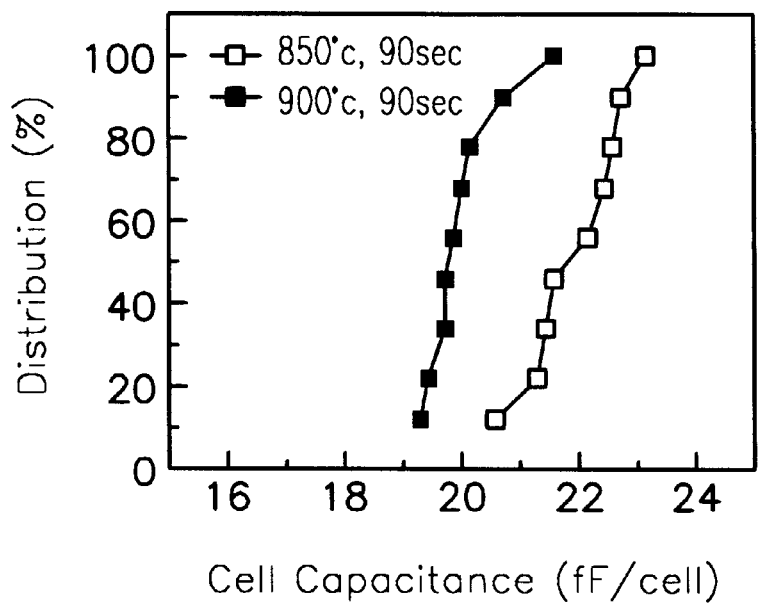
FIG. 2 is a graph of cell capacitance values measured after an RTN process is performed on a storage node having a surface with hemispherical grains (HSGs).
Figure 3:
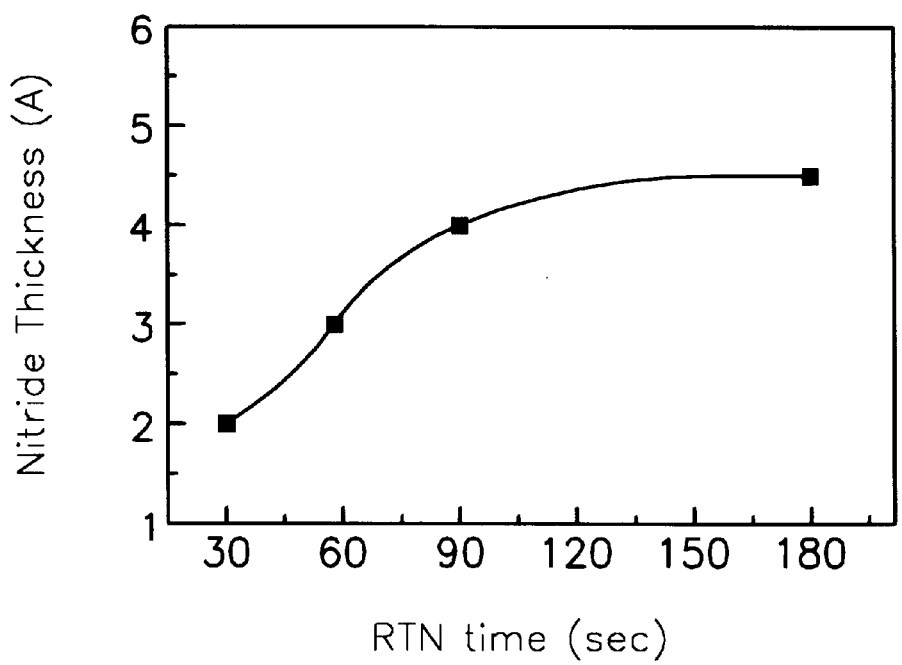
FIG. 3 is a graph of the thicknesses of a nitride layer formed by performing an RTN-process at 850° C. for various times.
Figure 4:
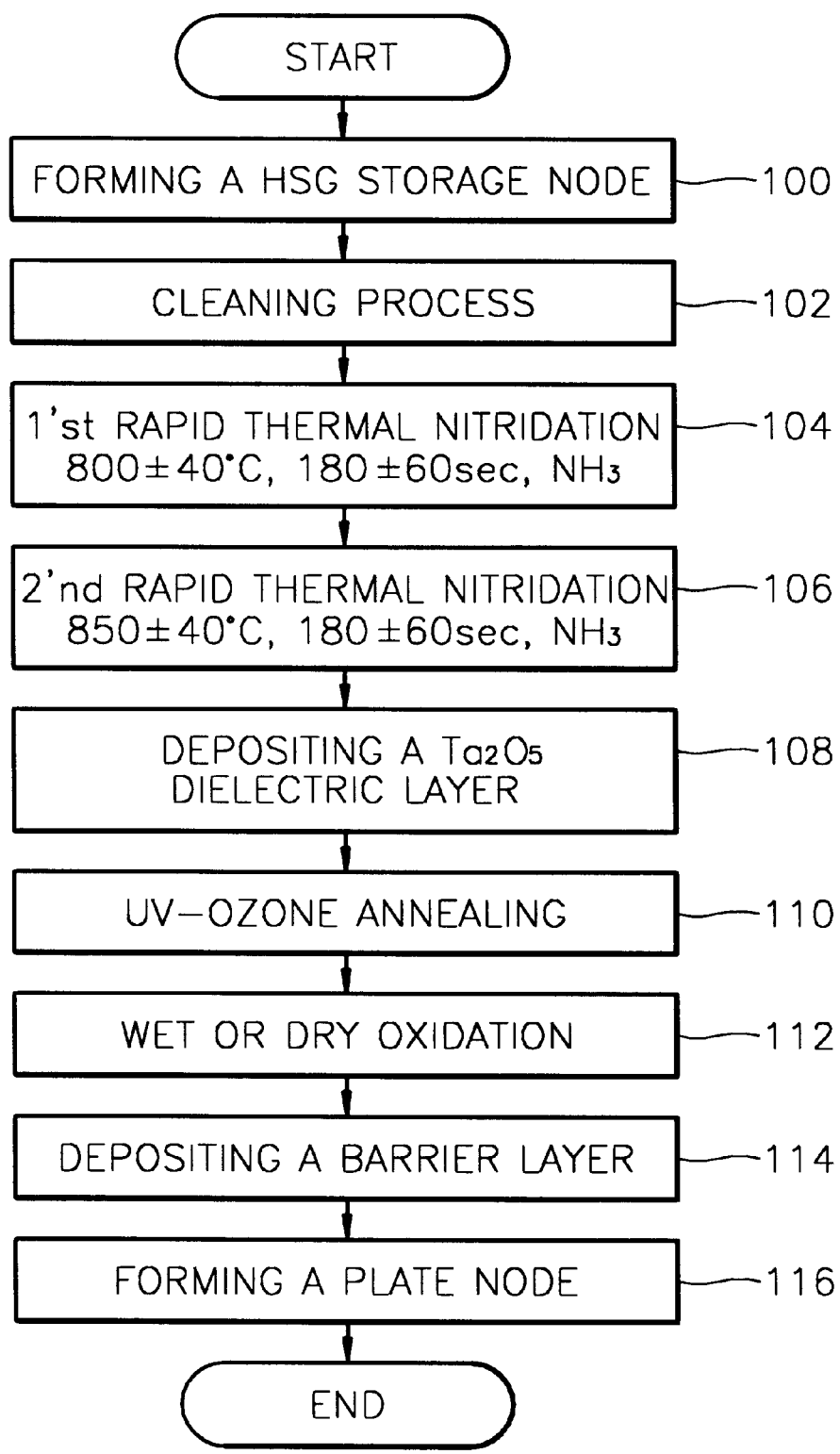
FIG. 4 is a flowchart illustrating a first embodiment of a method for forming a capacitor having a $Ta_2O_5$ dielectric layer according to the present invention.

FIG. 4 is a flowchart illustrating a first embodiment of a method for forming a capacitor having a $Ta_2O_5$ dielectric layer according to the present invention. Referring to FIG. 4, a capacitor storage node having, for example, HSGs, is formed on a semiconductor substrate where a lower structure such as a transistor is formed (step 100). Subsequently, the semiconductor substrate where the HSG storage node is formed is cleaned using an HF solution (step 102). Then, the semiconductor substrate is processed where the HSG storage node is formed through first rapid thermal nitridation (RTN) in an $NH_3$ atmosphere at 800±40° C. for 180±60 sec (step 104). At this time, a nitride layer of approximately 3 Å is formed on the surface of the HSG storage node through the first RTN process. The semiconductor substrate is then processed through second RTN operation in a $NH_3$ atmosphere at 850±40° C. for 180±60 sec (step 106). As a result, an additional 4 Å is added to the nitride layer, thereby form a nitride layer of having a thickness of 7 Å or more. This nitride layer acts as an oxidation barrier.

A dielectric layer of $Ta_2O_5$ is then deposited on the semiconductor substrate through low pressure chemical vapor deposition (LPCVD) where the first and second RTN-process have been performed (step 108). The semiconductor substrate is UV-ozone annealed where the $Ta_2O_5$ dielectric layer is deposited (step 110), and the annealed semiconductor substrate is then wet or dry oxidized (step 112). Accordingly, oxygen vacancy in the $Ta_2O_5$ dielectric layer is suppressed, thereby suppressing leakage current.

At this time, the oxygen vacancy in the $Ta_2O_5$ dielectric layer is preferably compensated through dry oxidation at 800° C. for 30 min. Since the nitride layer formed through the two step RTN process is approximately 7 Å or more, the nitride layer acts as an oxidation barrier during oxidation (step 112), thereby suppressing growth of an oxide layer having a low dielectric constant such as $SiO_2$ layer under the nitride layer. Accordingly, the capacitance is maintained at a high level because the overall thickness of the dielectric layer does not increase.

A barrier layer of TiN is deposited on the resultant structure (step 114) and a plate node is formed (step 116), thereby completing the process of forming a $Ta_2O_5$ capacitor in accordance with to the first embodiment of the present invention. Through the two step RTN operation performed at 800° C. and 850° C. described above, a nitride layer of 7 Å or thicker is obtained, but effective area of the storage node due maintained because HSG agglomeration is avoided. Thus, reduction in the cell capacitance is suppressed.

Embodiment 2

Figure 5:
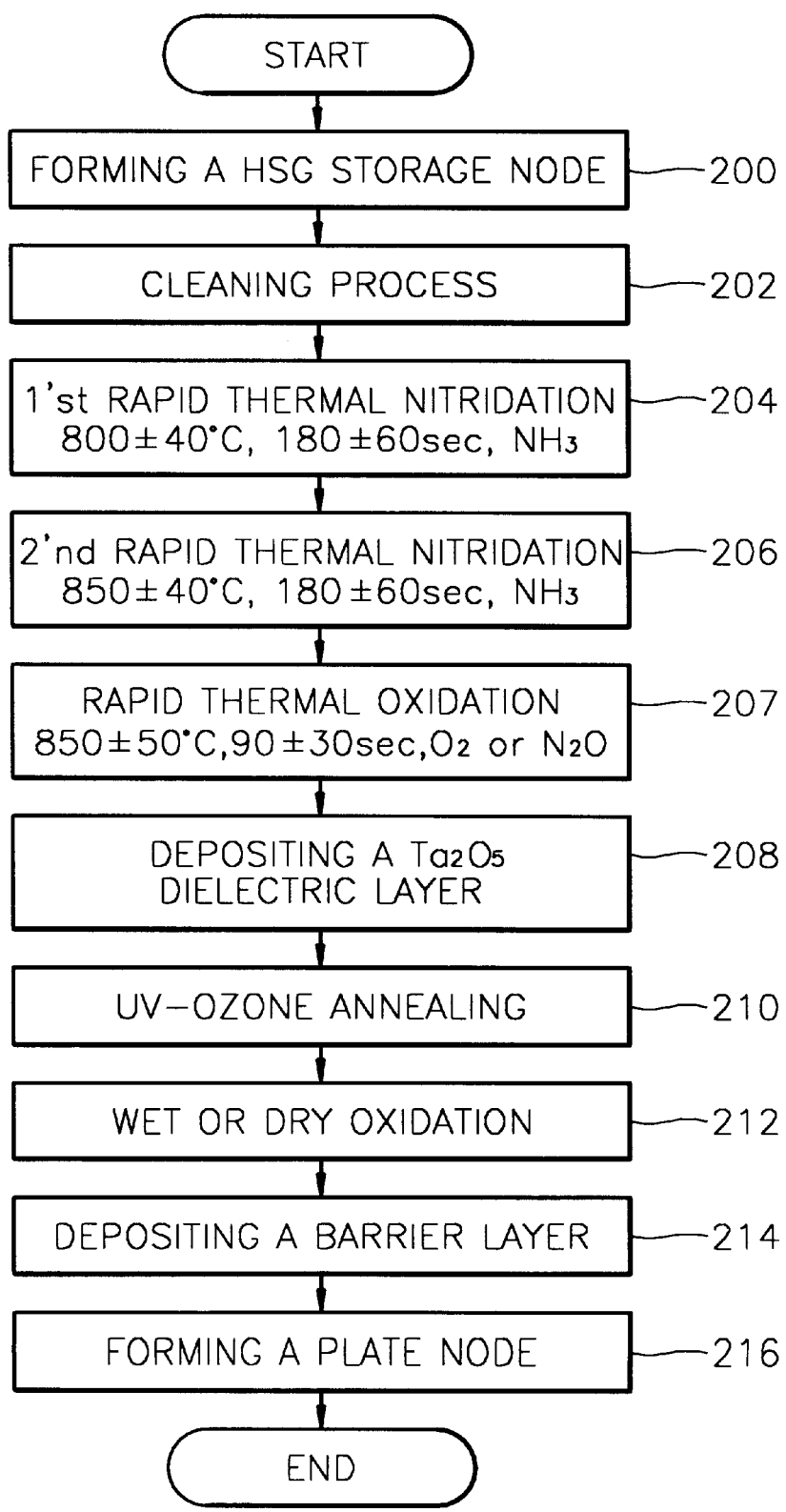
FIG. 5 is a flowchart illustrating a second embodiment of a method for forming a capacitor having a $Ta_2O_5$ dielectric layer according to the present invention.

FIG. 5 is a flowchart illustrating a second embodiment of a method for forming a capacitor having a $Ta_2O_5$ dielectric layer according to the present invention. In the second embodiment, the two step RTN process for forming the nitride layer is performed as in the first embodiment, and then a rapid thermal oxidation (RTO) process is performed so as to form a layer composed of a nitride layer and an oxide layer acting as an oxidation barrier.

Referring to FIG. 5, all of the steps except the RTO process are performed in the same manner those of the first embodiment. Accordingly, the steps that are the same as those of the first embodiment are not described.

The RTO process will now be described in detail. The RTO process is performed in an $O_2$ or $N_2O$ atmosphere at 850±50° C. for 90±30 sec (step 207) on the semiconductor substrate where the storage node has been formed, the cleaning has been performed and the two step RTN has been performed (steps 200, 202, 204 and 206), to thereby form a combined layer comprising a nitride layer and an oxide layer on the HSG storage node. Then, a dielectric layer of $Ta_2O_5$ is deposited (step 208), and then subsequent processes (steps 210, 212, 214 and 216) are performed in the same manner as those of the first embodiment, thereby completing the formation of a $Ta_2O_5$ dielectric layer capacitor.

The capacitance of a device fabricated in accordance with the second embodiment of the present invention is somewhat lower than the capacitance of a device fabricated in accordance with the first embodiment. However, the structure is more easily applicable to a manufacturing process for DRAMs using $Ta_2O_5$ dielectric layers.

EXAMPLE

Figure 6:
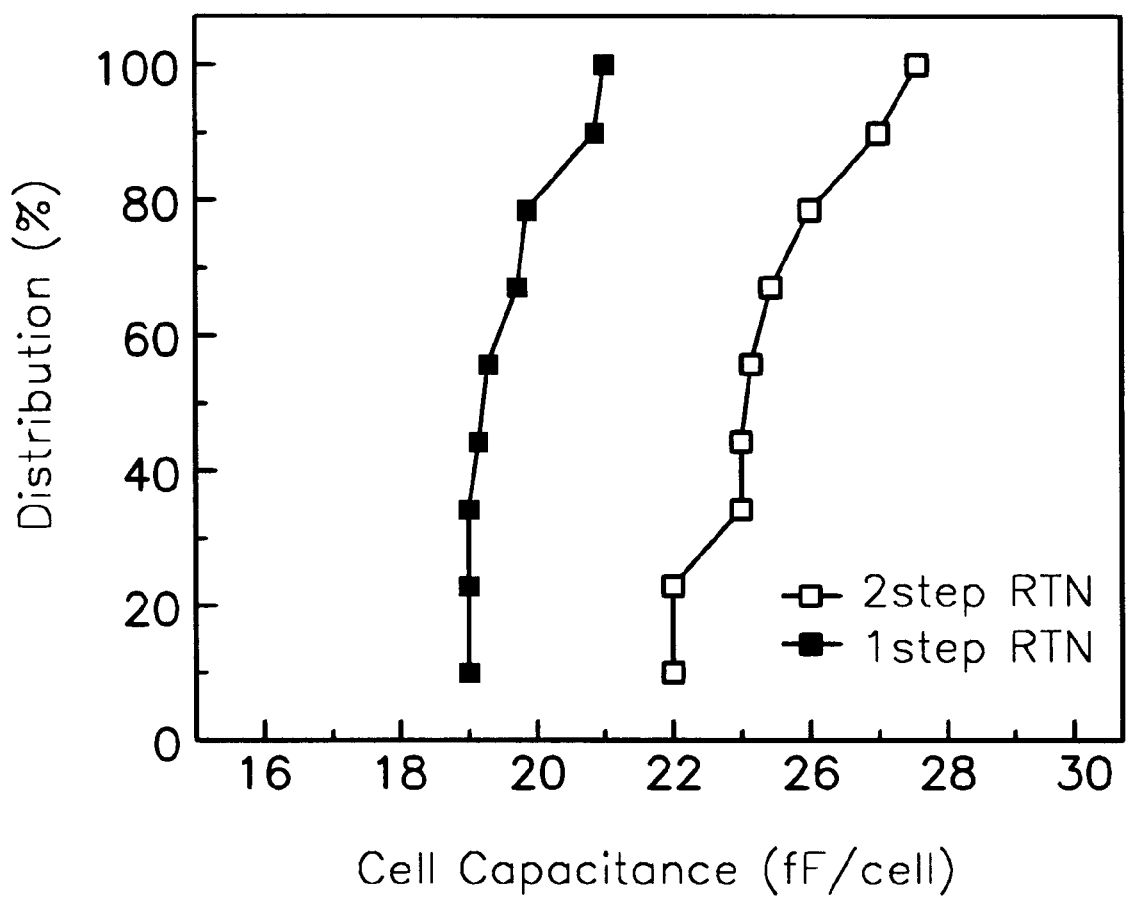
FIG. 6 is a graph illustrating the difference in cell capacitance between an exemplary device formed through the conventional one step RTN process at 900° C. and an exemplary device formed through a two step RTN process according to the present invention at 800° C. and 850° C.

FIG. 6 is a graph illustrating the difference in cell capacitance between an exemplary device formed through the conventional one step RTN process at 900° C. and an exemplary device formed through a two step RTN process according to the present invention at 800° C. and 850° C. Referring to FIG. 6, the Y-axis indicates a distribution (%) of measured points and the X-axis indicates cell capacitance values (fF/cell). When the one step RTN is performed at 900° C., i.e., in a line represented by (■), the capacitance of the resulting cells is 19~21.2 fF/cell. This is because HSGs on the surface of a storage node are agglomerated due to the high temperature of 900° C., thereby reducing the overall surface area of the storage node. However, with the two step RTN performed at 800° C. and 850° C., i.e., in a line represented by (□), the capacitance of the resultant cells is 22~25.5 fF/cell. This is because a relatively low temperature of 800~850° C. suppresses agglomeration of the HSGs on the surface of the storage node.

In general, the cell capacitance is measured and compared on the basis of a distribution of 50%. At this point, the capacitance of cells produced through the prior art one-step RTN process at 900° C. is 19.3 fF/cell, and the capacitance of cells produced through the two-step RTN process at 800° C. and 850° C. according to the present invention is 23.2 fF/cell. Thus, the capacitance is increased by 3.9 fF/cell.

A method for forming a capacitor having a $Ta_2O_5$ dielectric layer in accordance with the present invention prevents transformation of HSGs on a storage node, and the thickness of the nitride layer, which acts as an oxidation barrier, is increased, thereby enhancing the capacitance characteristics of a semiconductor device having capacitor.

It should be understood that the invention is not limited to the illustrated embodiments and that many changes and modifications can be made within the scope of the invention by a person skilled in the art. For example, a capacitor storage node used with the present specification is not limited to a specified formation such as a hemi-spherical grain (HSG) storage node. Accordingly, we claim all modifications and variations coming within the spirit and scope of the following claims.

What is claimed is:

1. A method for forming a capacitor having a tantalum oxide dielectric layer comprising:
    a) forming a capacitor storage node on a semiconductor substrate;
    b) performing a first rapid thermal nitridation (RTN) process on the semiconductor substrate at a first temperature that does not change the electrical characteristics of the storage node, thereby forming a nitride layer;
    c) performing a second RTN process on the semiconductor substrate at a second temperature, thereby making the nitride layer thicker; and
    d) depositing a tantalum oxide dielectric layer over the nitride layer.

2. The method of claim 1, wherein step a) includes forming a storage node having a surface with hemispherical grains.

3. The method of claim 1, further including cleaning the semiconductor substrate after forming the storage node.

4. The method of claim 1, wherein the first temperature is 800±40° C.

5. The method of claim 1, wherein the first RTN process is performed for 180±60 sec.

6. The method of claim 1, wherein the second temperature is 850±40° C.

7. The method of claim 1, wherein the second RTN process is performed for 180±60 sec.

8. The method of claim 1, further including performing a rapid thermal oxidation (RTO) process on the semiconductor substrate after the second RTN process is performed.

9. The method of claim 8, wherein the RTO process is performed at 850+50° C.

10. The method of claim 8, wherein the RTO process is performed for 90±30 sec.

11. The method of claim 8, wherein the RTO process is performed in an $O_2$ or $N_2O$ atmosphere.

12. The method of claim 1, wherein the second temperature is higher than the first temperature.

13. A method for forming a capacitor on a semiconductor substrate comprising:
    forming a capacitor storage node on the semiconductor substrate;
    forming a nitride layer having a thickness on the storage node through a first rapid thermal nitridation (RTN) process at a first temperature that does not change the electrical characteristics of the storage node;
    increasing the thickness of the nitride layer by performing a second RTN process at a second temperature; and
    depositing a dielectric layer over the nitride layer.

14. The method of claim 13, wherein the first temperature is 800±40° C.

15. The method of claim 13, wherein the first RTN process is performed for 180±60 sec.

16. The method of claim 13, wherein the second temperature is 850±40° C.

17. The method of claim 13, wherein the second RTN process is performed for 180±60 sec.

18. The method of claim 13, wherein the second temperature is higher than the first temperature.

19. A method for forming a capacitor on a semiconductor substrate comprising:
    a step for forming a capacitor storage node on the semiconductor substrate;
    a step for forming a nitride layer having a thickness on the storage node;
    a step for increasing the thickness of the nitride layer; and
    a step for depositing a dielectric layer over the nitride layer.

20. A method according to claim 19, wherein:
    the step for forming a nitride layer comprises performing a first RTN process at a first temperature; and
    the step for increasing the thickness of the nitride layer comprises performing a second RTN process at a second temperature that is higher than the first temperature.

* * * * *

UNITED STATES PATENT AND TRADEMARK OFFICE
CERTIFICATE OF CORRECTION

PATENT NO. : 6,207,488 B1
DATED : March 27, 2001
INVENTOR(S) : Ki-hyun Hwang, Jae-young Park and Jae-ho Byun It is certified that error appears in the above-identified patent and that said Letters Patent is hereby corrected as shown below:

<u>Column 6,</u>
Line 5, "850 + 50° C" should read -- 850 ± 50 °C --.

Signed and Sealed this

Fourth Day of June, 2002

*Attest:*

JAMES E. ROGAN
*Attesting Officer*     *Director of the United States Patent and Trademark Office*